United States Patent [19]

Vinson

[11] 4,225,879
[45] Sep. 30, 1980

[54] V-MOS FIELD EFFECT TRANSISTOR FOR A DYNAMIC MEMORY CELL HAVING IMPROVED CAPACITANCE

[75] Inventor: Mark A. Vinson, San Diego, Calif.

[73] Assignee: Burroughs Corporation, Detroit, Mich.

[21] Appl. No.: 6,660

[22] Filed: Jan. 26, 1979

Related U.S. Application Data

[63] Continuation of Ser. No. 864,383, Dec. 27, 1977, abandoned.

[51] Int. Cl.² .............................................. H01L 29/06
[52] U.S. Cl. ........................................ 357/55; 357/23; 357/41; 357/45
[58] Field of Search ................... 357/23, 41, 45, 55

[56] References Cited
U.S. PATENT DOCUMENTS 4,003,036  1/1977  Jenne ..................................... 357/55
4,119,996  10/1978  Jhabuala ................................ 357/55

Primary Examiner—Edward J. Wojciechowicz
Attorney, Agent, or Firm—Charles J. Fassbender; Mervyn L. Young; Kevin R. Peterson

[57] ABSTRACT

This disclosure relates to a V-MOS field effect transistor which is provided with enhanced source capacitance to provide a single transistor dynamic memory cell. The formation of the source area is achieved by masking the silicon substrate, opening an aperture in the mask and then etching the silicon substrate in such a manner as to undercut the mask so that the mask provides a shield to subsequent ion implanting of the source area. Both P and N type dopants can be separately implanted with different energy levels so as to form an enhanced PN junction capacitance for the device. Such a field effect transistor can be achieved without the formation of a graded dopant concentration in the channel between the source and drain areas of the transistor.

8 Claims, 12 Drawing Figures

V-MOS FIELD EFFECT TRANSISTOR FOR A DYNAMIC MEMORY CELL HAVING IMPROVED CAPACITANCE

RELATED U.S. PATENT APPLICATIONS

This is a continuation of application Ser. No. 864,383, filed Dec. 27, 1977, now abandoned.

U.S. Patent applications directly or indirectly related to the subject application are as follows:

Ser. No. 864,247, filed Dec. 27, 1977, by Mark A. Vinson, and entitled, "Method of Making a V-MOS Field Effect Transistor For a Dynamic Memory Cell Having Improved Capacitance."

BACKGROUND OF THE INVENTION

Field of the Invention

This invention relates to a V-MOS field effect transistor for a dynamic memory cell and, more particularly, to such a device having an enhanced capacitance and a channel with uniform rather than a graded dopant concentration.

Description of the Prior Art

MOS field effect transistors are formed by diffusing source and drain areas into a crystalline substrate, covering the substrate with an insulating layer and placing a conductive gate electrode material on top of the insulating layer between the source and drain areas. When an appropriate voltage is applied to the gate electrode, the resulting electric field causes a channel for charge carriers to be formed between the source and drain areas. Hence, the name field effect transistor. V-MOS field effect transistors are so called because the transistor is formed along the walls of a V-shaped groove or pit as distinct from previous planar field effect transistors. With conventional V-MOS technology, the source of the transistor is formed below the drain area thus reducing the amount of space required for each transistor on the surface of the crystalline substrate. Such V-MOS structures are disclosed, for example in the Rodgers U.S. Pat. No. 3,924,265 and the Jenne U.S. Pat. No. 4,003,036.

Since the drain area is placed above the source area in conventional V-MOS technology, additional process steps are generally required as compared to the planar MOS technology described above. In the existing V-MOS structures, an N-type source area is first formed by diffusion in a P-type crystalline silicon substrate, and then a separate layer of lightly P-doped silicon material is epitaxially grown over the source area. The N-type drain areas are formed in the epitaxial layer which is then covered with an oxide or other insulation, the V-notch or pit is etched, the gate insulator is grown or deposited and then the gate electrode layer is formed over the V. These extra steps involve unusually difficult process operations and additional time and thus increase the cost of the wafers from which the integrated circuit chips are formed. However, such a process does allow for the provision of a larger source area to provide increased source capacitance when the device being fabricated is a dynamic memory cell such as disclosed in the above-referred-to Jenne patent.

It is then an object of the present invention to provide an improved V-MOS field effect transistor.

It is another object of the present invention to provide an improved V-MOS field effect transistor that requires fewer and less difficult steps for fabrication.

It is still a further object of the present invention to provide an improved dynamic memory cell employing a V-MOS field effect transistor.

SUMMARY OF THE INVENTION

In order to achieve the above-described objects, the present invention resides in a V-MOS field effect transistor which is provided with enhanced source capacitance to provide a single transistor dynamic memory cell. The formation of the source area is achieved by masking the silicon substrate, opening an aperture in the mask and then etching the silicon substrate in such a manner as to undercut the mask so that the mask provides a shield to subsequent ion implanting of the source area. Both P and N type dopants can be separately implanted with different energy levels so as to form an enhanced PN junction capacitance for the device. Such a field effect transistor can be achieved without the formation of a graded dopant concentration in the channel between the source and drain areas of the transistor.

A feature, then, of the present invention resides in a V-MOS field effect transistor having substrate with a V-shaped notch or pit etched therein and a source area formed around the lower portion of the V by implanting ions or P or N type dopants.

BRIEF DESCRIPTION OF THE DRAWINGS

The above and other objects, advantages and features of the present invention will become more readily apparent from a review of the following specification when taken in conjunction with the drawings wherein.

DESCRIPTION OF THE INVENTION

Figure 1:
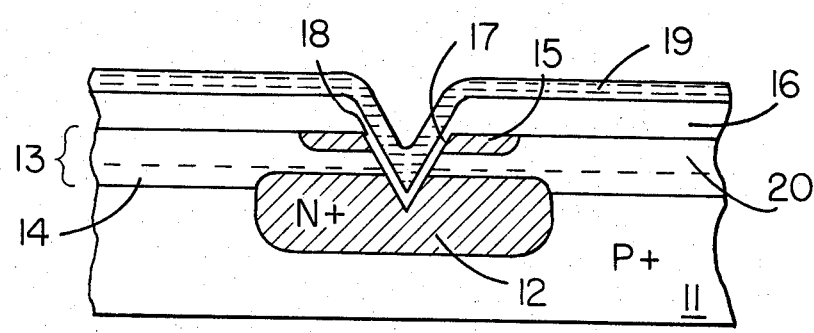
FIG. 1 is a cross-section of a field effect transistor and memory cell of the prior art.

A typical V-MOS field effect transistor structure is illustrated in FIG. 1. This is the type of structure disclosed in the above-referred-to Jenne patent. The particular device illustrated is formed of a crystalline silicon substrate 11 which in this case is doped with a P-type dopant such as boron, the device being formed being a N-channel device. N+ buried layer 12 is formed in substrate 11 and epitaxial layer 13 is grown thereover which layer is of a lightly doped P-type material. An intermediate layer 14 will be formed in the lower portion of the epitaxial layer 13 by out-diffusion of the P-type dopant from the P+ substrate 11, that intermediate layer 14 being P-type with graded dopant concentration profile. Because this graded-concentration profile region 14 exists in the MOS transistor channel, it will control the threshold voltage of that transistor and give that transistor asymmetrical electrical characteristics. A relatively thin N+ material 15 is formed in the upper surface of epitaxial layer 13 as to reside above N+ layer 12 and epitaxial layer 13 is then covered with a passive layer 16 such as silicon dioxide. A V-shaped recess 17 is then etched into the structure, which recess extends into the buried capacitor or N+ layer 12. A thin gate oxide layer 18 covers the surfaces of this recess which oxide layer and recess are then covered with a conductive material 19 to form a field effect transistor gate. N+ layer 15 comprises the drain of the V-MOS device and buried layer 12 comprises the source of that device with a channel 20 between the source and the drain being the epitaxial P material 13 which includes intermediate layer 14. Thus, a field effect transistor and storage capacitor 12 have been formed which require less surface area of substrate 11 than would be required by corresponding planar field effect transistor with storage capacitor.

As was indicated above, a difficulty with such a prior art structure is the need of the epitaxial silicon layer as it is difficult to grow such a layer with sufficient control over the resistivity. Furthermore, defects in the epitaxial layer are generally of much higher density than those of bulk silicon, thereby degrading the performance of the transistor and the capacitor.

Figure 2A:
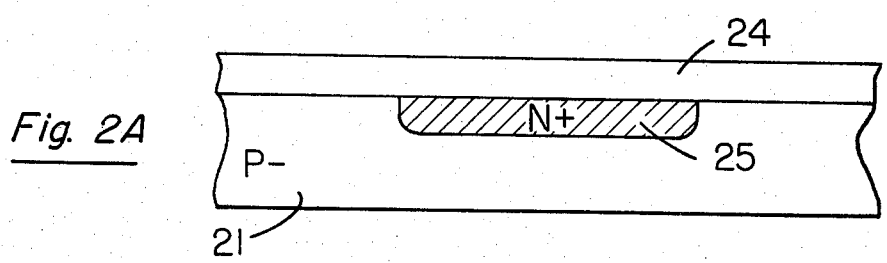
FIGS. 2A–E are cross-sectional views representing steps employed in the formation of one embodiment of the present invention.
Figure 2B:
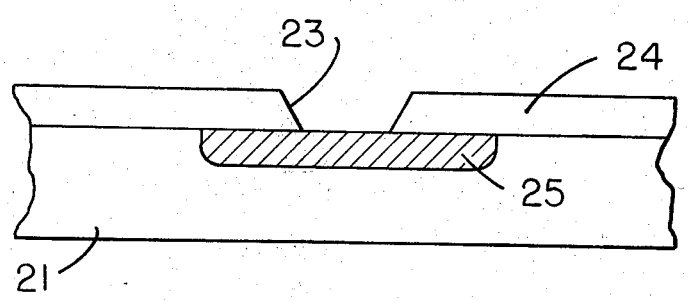
Figure 2C:
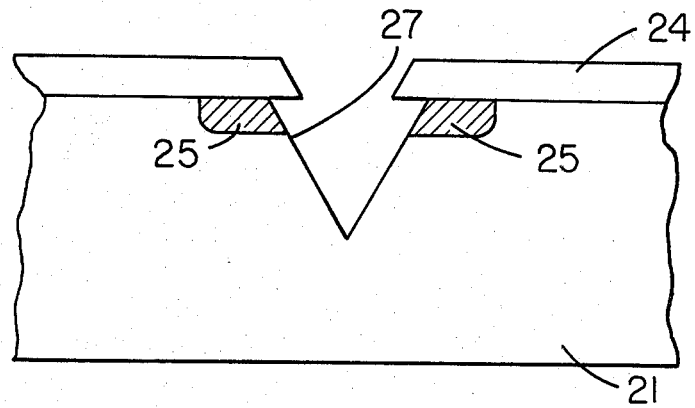

The present invention is directed towards a method for implant doping the bottom of the V-groove etched in the silicon without doping the side walls of the groove and the structure resulting therefrom. The method resulting in one embodiment of the present invention can best be described with reference to FIGS. 2A–E. A P-type silicon wafer 21 with a <100> orientation is provided with shallow N+ diffused regions 25 and then covered with a masking layer 24 which may be $SiO_2$ or $SiO_2$ and $Si_3N_4$ or similar material. The resulting structure is as illustrated in FIG. 2A. A small rectangular area 23 is photolithographically formed over the N+ region where the transistor is to be located and the rectangle etched through the masking layer 24 to expose the underlying silicon as illustrated in FIG. 2B. The exposed silicon is then etched with an anisotropic silicon etch (such as dilute KOH) to form a V pit 27 whose sides are <111> silicon planes. The etch is continued until the width of the V pit or groove 27 at the $SiO_2$-silicon interface is much wider than the original rectangular opening 23 in the $SiO_2$. It is preferable that the V pit or groove be two or three times as wide as the opening. the resultant structure is illustrated in FIG. 2C.

Figure 2D:
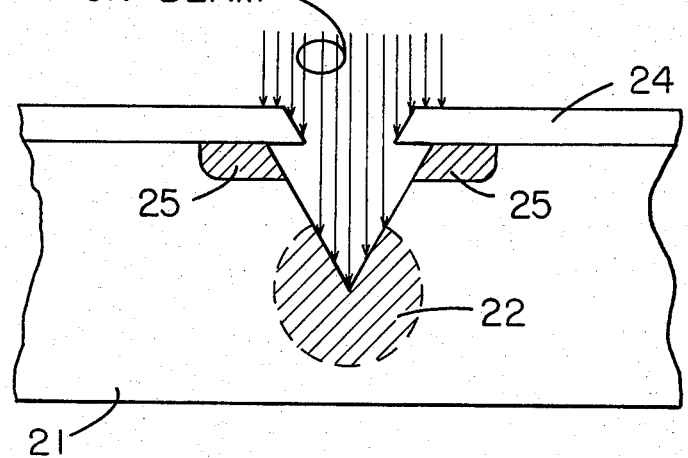

At this point, an N-type dopant is ion implanted into the wafer, the ion beam being normal to the plane of the wafer. The energy employed must be sufficiently low to insure that the implant will not penetrate the masking layer 24. As a result, only the bottom portion 22 of the V pit or groove will be implant-doped due to the shielding effect of the overhanging edges of the masking layer 24. The resultant structure will be as illustrated in FIG. 2D.

Figure 2E:
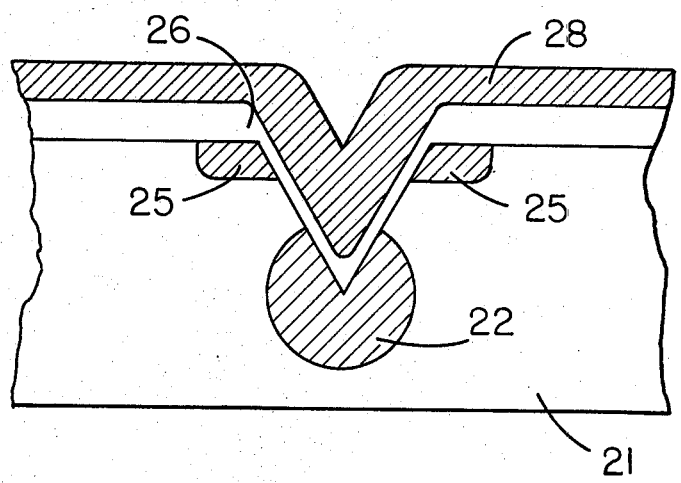

The masking layer 24 is then removed and the wafer subjected to a thermal cycle to drive-in the implanted N+ junction. A gate oxide 26 is grown and the polysilicon or other gate electrode material 28 is deposited over the V pit or groove. The gate electrode pattern is defined photolithographically and the device structure has been completed. The final structure is as illustrated in FIG. 2E. Because a typical V-MOS circuit will also contain planar N-MOS devices, some additional process steps will follow which will not directly affect this V-MOS device structure.

Figure 3A:
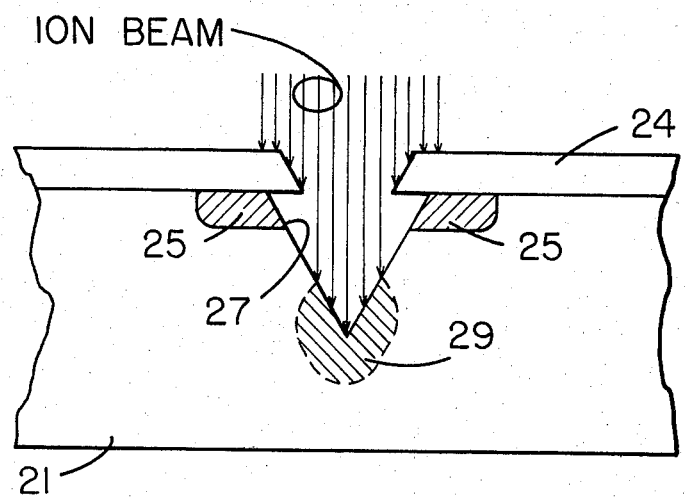
FIGS. 3A–C are cross-sectional views representing series of steps involved in the formation of the second embodiment of the present invention.
Figure 3B:
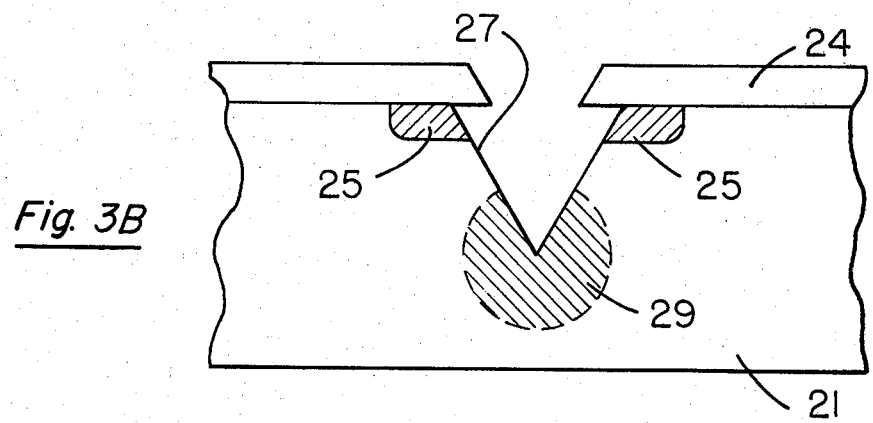
Figure 3C:
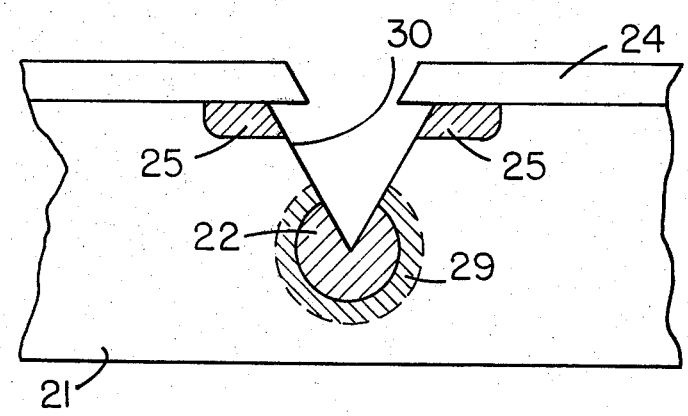

Variations may be provided both in the method and the resultant V-MOS device structure as described above. For example, after the V pit 27 has been etched wider than the overhanging masking edges, two additional steps may be performed to provide a relatively low dosage P-type implant and thermally drive-in that implant before the N-type dopant is implanted and thermally driven in. This is illustrated in FIGS. 3A–C where the P-type implant results in region 29. The result of these additional steps is to increase the capacitance of the junction of N+ source 22 by increasing the P-type doping level 29 surrounding that junction.

It will be noted from the embodiment in FIGS. 3A–C that the P+ region 29 completely surrounds the N+ source 22 in the crystalline substrate such that a graded channel 30 will be formed between source 22 and drain 25. While this provides more capacitance at the source PN junction, it is disadvantageous in certain applications as it increases the channel threshold voltage and makes the threshold voltage more difficult to control. The graded channel also gives the V-MOS transistor asymmetrical electrical characteristics.

Figure 4A:
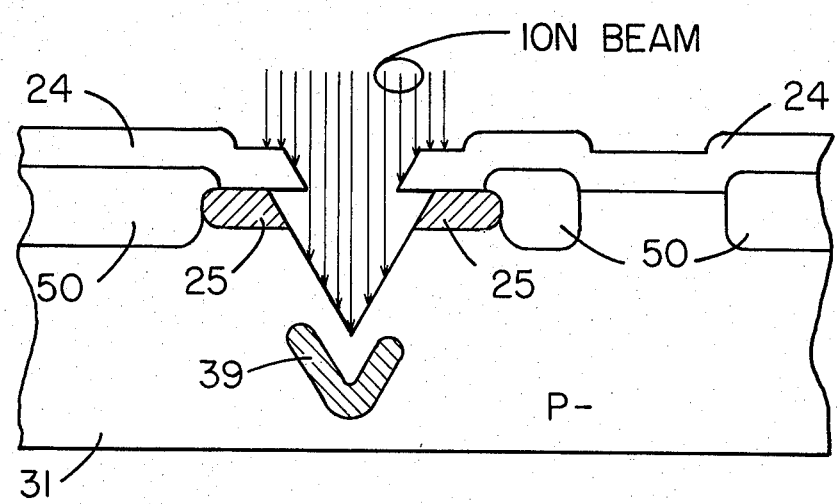
FIGS. 4A–C are cross-sectional views representing the steps involved in the formation of the third embodiment of the present invention.
Figure 4B:
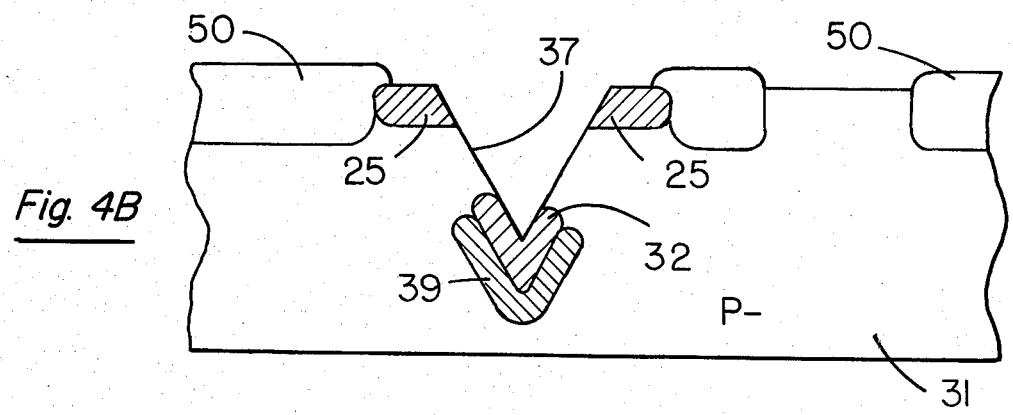
Figure 4C:
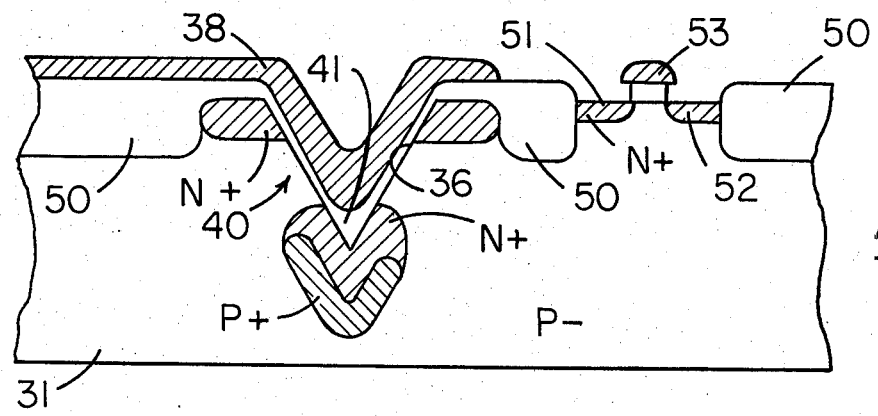

To overcome this disadvantage, another embodiment is provided which is illustrated in FIGS. 4A–C. In this embodiment, the V groove or pit 37 is opened in the same way as was described in regard to earlier embodiments. However, the P+ dopant 39, which may be boron, is first implanted using relatively high implant energy so as to be implanted to some depth, which may be 0.4 to 0.9 microns typically. Then the N+ dopant 32, which may be phosphorous, is implanted to a lesser depth, which may be 0.1 to 0.3 microns typically with approximately the same concentration as the P+ dopant 39 but implanted using lower energy. The structure is then annealed but there is no long thermal drive-in to cause much diffusion of the respective N-type and P-type regions 32 and 39. The gate oxide 36 and conductive gate material 38 are then formed to complete the device. With the embodiment of FIGS. 4A–C, a smaller PN junction area is provided but a higher capacitance can be achieved because of the higher dopant concentration of the implanted regions 39 and 32 at the PN junction between the regions. In addition, the channel region does not have a graded concentration profile and therefore will have symmetrical electrical characteristics.

A particular advantage of all three embodiments is that the oxide layer 38 over the N+ region 32 will be significantly thicker than over the channel 40 since such oxides will grow more readily over a heavily N+ doped region. In the embodiment of FIGS. 4A–C shallow-implant N+ region 32 may be formed before deep-implant P+ region 39 by simply interchanging the two implant operations with no change to the resulting structure.

As illustrated in the embodiment of FIGS. 4A–C, oxide regions 50 are grown during the fabrication process so as to provide for oxide iolation between active elements which are spaced close together where such an additional element may be another V-MOS device or a planar N-MOS transistor formed of source area 51, drain area 52 and gate area 53. The purpose of oxide isolation region 50 is to prevent conductive channels from being formed between such active devices. Heavily doped P-type regions may be formed beneath field oxide regions 50 to provide additional isolation between adjacent devices if required.

Although the regions occupied by the source capacitance of the embodiment of FIGS. 4A–C has been reduced, the magnitude of such capacitance can be increased by the increasing of the dopant concentrations of N region 32 and P region 39. As was indicated above, this provides an advantage over the embodiments of FIGS. 3A-C. In that embodiment, the P region 29 completely surrounds the N region 22, resulting in a graded dopant concentration along the channel 30. When an attempt is made to increase the capacitance of the device of this embodiment by increasing the dopant concentration of the P region 29, the threshold voltage of channel 30 is correspondingly increased. This problem is not encountered in the embodiment of FIGS. 4A-C. Thus, the capacitance of the embodiment of FIGS. 4A-C can be increased as much as desired, the only restraint being that, as that capacitance is increased, the breakdown voltage of the corresponding PN junction is correspondingly decreased. Relatively speaking, the embodiment of FIGS. 4A-C can be made to have a capacitance several times higher than the embodiment of FIGS. 3A-C and yet have a breakdown voltage in the range of 6 to 12 volts which is quite acceptable for many applications.

As has been indicated before, a particular feature of the present invention is the undercutting of the silicon dioxide/silicon nitride mask during the etching of the silicon substrate so as to provide the appropriate shielding during the ion implant operation. Some characteristics of one such etching technique will now be described. Assuming a silicon substrate with a <100> crystal orientation and a mask of 3000 Å of $SiO_2$ and 1500 Å of $Si_3N_4$, the silicon nitride is etched in a plasma etcher, the silicon dioxide is etched with hydrofluoric acid and the silicon substrate is then etched with a mixture of KOH and water where the etch is performed at a temperature of approximately 75° C. After approximately 8 minutes, the mask was undercut approximately 0.7 microns on each side of the V pit. After approximately 12 minutes, the undercut was approximately 0.96 microns. After 24 minutes, the undercutting was approximately 1.49 microns. And after 64 minutes, the undercutting was approximately 3.2 microns. The undercutting rate with the above-described conditions was approximately 0.055 microns per minute for etch times longer than 20 to 30 minutes. The undercutting appeared to be quite uniform and provided a good undercut edge definition. For the embodiments of FIGS. 3 and 4, the masking layer of $SiO_2$ and $Si_3N_4$ is replaced by a layer of phosphosilicate glass or similar material of approximately 1 to 1.5 μ thickness.

The operation of the various embodiments are essentially the same and will now be described for the embodiment of FIG. 2E. To write binary data into the cell, a bit of data is applied to the N+ bit line which is drain region 25. This will typically be zero volts for a "0" data bit and five to twelve volts for a "1." The word line which is conductor 28 is then raised from below the device threshold voltage which is typically 0.5 volts to 1.5 volts to a voltage well above that threshold voltage in the range of five to twelve volts. This turns the device "on" and allows current to flow between source region 22 and drain region 25. At this time the bit of data being applied to the bit line will be transferred to the PN junction storage capacitor of source region 22 and substrate 21. A "0" data bit will cause no change in the source junction while a "1" will charge the junction to the "1" applied voltage thereby enlarging the depletion region around the N+ source junction. This "charge" or "no charge" condition in the N+ source junction represents the difference between a "1" or a "0" written into that memory cell. The word line 28 is now returned to a voltage below the threshold voltage thereby cutting off the channel between source 22 and drain 25 leaving the source junction storage capacitor in its appropriate data bit state.

To read the data out of the cell, word line 28 is raised from below the threshold voltage to a voltage well above the threshold voltage thereby turning on the device. The "charge" or "no charge" condition of the N+ source junction storage capacitor will cause a change or no change in the voltage on bit line 25 indicating whether that storage capacitor was charged or not. Any change in the voltage on the bit line is detected by appropriate sense amplifiers in another part of the circuit, thereby establishing whether that memory cell had contained a "1" or a "0" data bit.

EPILOGUE

A V-MOS field effect transistor has been described above which does not require the extra steps of epitaxial growth in order to form the source area of the transistor. Furthermore, such a transistor can be provided with enhanced source capacitance to provide a single transistor dynamic memory cell. The formation of the source area is achieved by masking the silicon substrate, opening an aperture in the mask and then etching the silicon substrate in such a manner as to undercut the mask so that the mask provides a shield to subsequent ion implanting of the source area. Both P and N type dopants can be separately implanted with different energy levels so as to form an enhanced PN junction capacitance for the device. Such a field effect transistor can be achieved without the formation of a graded dopant concentration in the channel between the source and drain areas of the transistor, thereby retaining electrical symmetry.

Although few embodiments of the present invention have been described, it will be evident to those skilled in the art that changes and modifications may be made therein without departing from the spirit and scope of the invention as claimed.

What is claimed is:

1. A field effect transistor comprising:
   a monocrystalline unitary substrate of one conductivity type, said substrate having a surface and uniform dopant concentration;
   a region in said substrate adjacent to said surface and having a conductivity of a second conductivity type;
   a V-shaped recess in said substrate extending from said surface through said region of said second conductivity type, said recess being defined by recess surfaces;
   a second region of said second conductivity type in said unitary substrate, said second region being formed adjacent to said recess surface at least at the tip of the V by implanting ions through an aperture that overlies and is smaller than the top of said V;
   an oxide layer covering the surfaces of the V-shaped recess; and
   a gate electrode material covering at least a portion of said oxide layer in said V-shaped recess.

2. A field effect transistor according to claim 1 which further includes:
   a third region in said unitary substrate, portions of said third regions being adjacent to said second region, said third region being of said one conductivity type but with a greater concentration of ions and being formed by implanting ions through an aperture that overlies and is smaller than the top of said V.

3. A field effect transistor according to claim 2 wherein:
said third region is larger than and includes said second region.

4. A field effect transistor according to claim 3 wherein:
said second region is formed by the implantation of phosphorous ions and said third region is formed by implantation of boron ions.

5. A field effect transistor comprising:
a monocrystalline unitary substrate of one conductivity type, said substrate having a surface and uniform dopant concentration;
a region in said substrate adjacent to said surface and having a conductivity of a second conductivity type;
a V-shaped recess in said substrate extending from said surface through said region of said second conductivity type, said recess being defined by recess surfaces;
a second region of said second conductivity type in said unitary substrate, said second region being formed adjacent to said recess surfaces at least at the tip of the V by implanting ions through an aperture that overlies and is smaller than the top of said V;
a third region of said one conductivity type but with a greater concentration of ions, portions of said third region being formed adjacent to said second region by ion implantation through said aperture;
an oxide layer covering the surfaces of said V-shaped recess; and
a gate electrode layer covering at least a portion of said oxide layer in said V-shaped recess.

6. A field effect transistor according to claim 5 wherein:
said third region is provided with a dopant concentration to have a greater conductivity of said one conductivity type than said crystalline substrate and said second region has a dopant concentration to provide a similar dopant concentration of said second conductivity type so as to provide an increased capacitance at the junction between said second and third regions.

7. A field effect transistor according to claim 5 wherein:
the ions in said third region are implanted to a depth of 0.4 to 0.9 microns and the ions in said second region are implanted to a depth of 0.1 to 0.3 microns.

8. A field effect transistor according to claim 5 wherein:
the ions implanted in said second region are phosphorous and the ions implanted in said third region are boron.

* * * * *